(12) United States Patent
Yen et al.

(10) Patent No.: US 11,705,401 B2
(45) Date of Patent: Jul. 18, 2023

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US); Kay Stefan Essig, Radebeul (DE)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 56 days.

(21) Appl. No.: 17/225,832

(22) Filed: Apr. 8, 2021

(65) Prior Publication Data

US 2022/0328416 A1    Oct. 13, 2022

(51) Int. Cl.
| | |
|---|---|
| H01L 23/538 | (2006.01) |
| H01L 23/00 | (2006.01) |
| H01L 23/31 | (2006.01) |
| H01L 23/49 | (2006.01) |
| H01L 21/48 | (2006.01) |
| H01L 21/56 | (2006.01) |

(52) U.S. Cl.
CPC ...... *H01L 23/5389* (2013.01); *H01L 21/4853* (2013.01); *H01L 21/4857* (2013.01); *H01L 21/4889* (2013.01); *H01L 21/565* (2013.01); *H01L 23/3128* (2013.01); *H01L 23/49* (2013.01); *H01L 23/5383* (2013.01); *H01L 23/5386* (2013.01); *H01L 24/16* (2013.01); *H01L 24/48* (2013.01); *H01L 2224/16227* (2013.01); *H01L 2224/48195* (2013.01); *H01L 2924/19103* (2013.01); *H01L 2924/19105* (2013.01)

(58) Field of Classification Search
CPC ............. H01L 23/5389; H01L 21/4853; H01L 21/4857; H01L 21/4889; H01L 21/565; H01L 23/3128; H01L 23/49; H01L 23/5383; H01L 23/5386; H01L 24/16; H01L 24/48; H01L 2224/16227; H01L 2224/48195; H01L 2924/19103; H01L 2924/19105

See application file for complete search history.

(56) References Cited

U.S. PATENT DOCUMENTS

| | | | |
|---|---|---|---|
| 7,145,233 B2 | 12/2006 | Vinson et al. | |
| 2016/0300817 A1* | 10/2016 | Do | ............ H01L 25/03 |
| 2018/0190621 A1* | 7/2018 | Yan | ....................... H01L 23/585 |
| 2018/0332708 A1* | 11/2018 | Lambert | ........... H01L 23/49827 |
| 2019/0341351 A1* | 11/2019 | May | ........................ H01L 24/25 |
| 2019/0385989 A1* | 12/2019 | Yu | ....................... H01L 23/5386 |
| 2022/0013452 A1* | 1/2022 | Kim | ...................... H01L 23/481 |

* cited by examiner

*Primary Examiner* — Kyoung Lee
*Assistant Examiner* — Christina A Sylvia
(74) *Attorney, Agent, or Firm* — Foley & Lardner LLP

(57) ABSTRACT

A semiconductor package structure and a method for manufacturing a semiconductor package structure are provided. The semiconductor package structure includes a substrate and a first passive device. The substrate has a first surface and a second surface opposite to the first surface. The first passive device includes a first terminal and a second terminal, wherein the first terminal is closer to the first surface than to the second surface, and the second terminal is closer to the second surface than to the first surface.

14 Claims, 14 Drawing Sheets

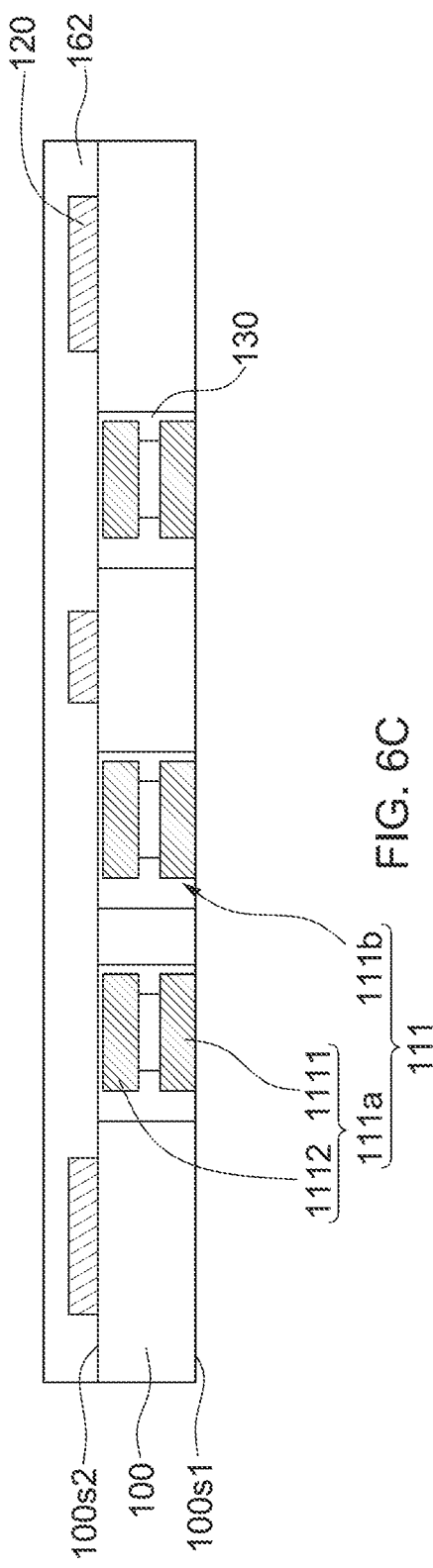
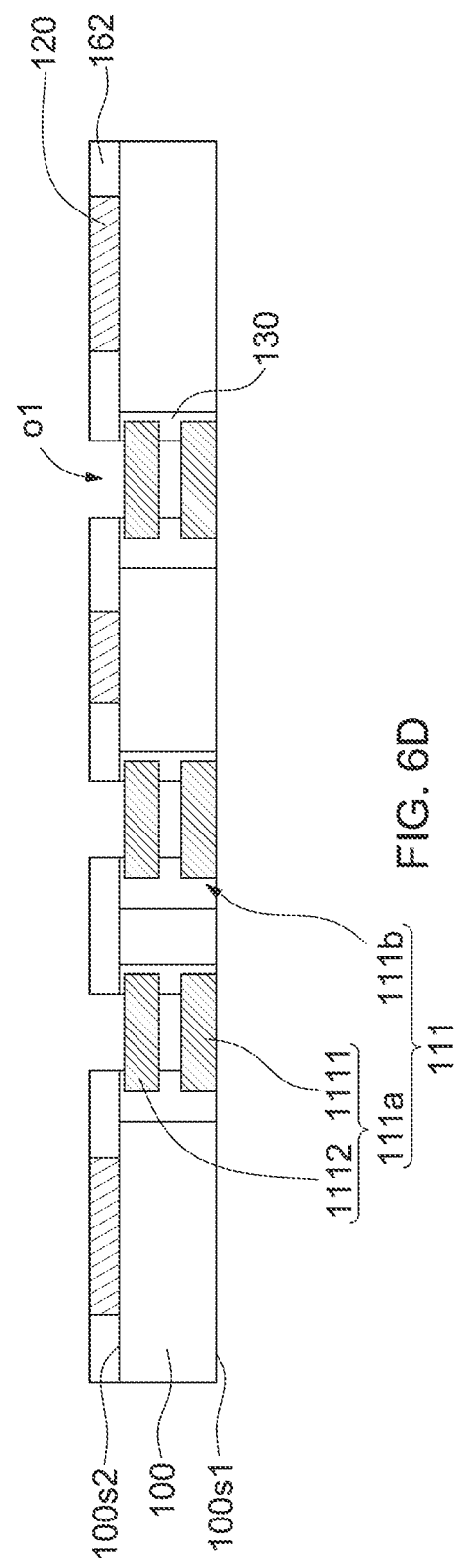

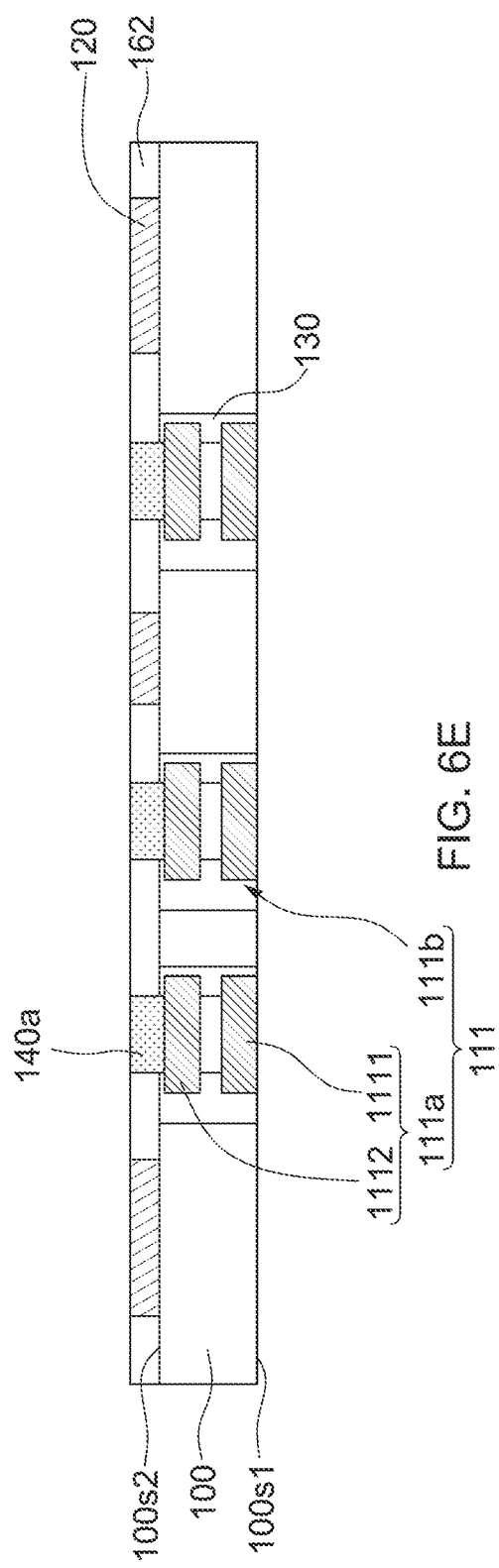
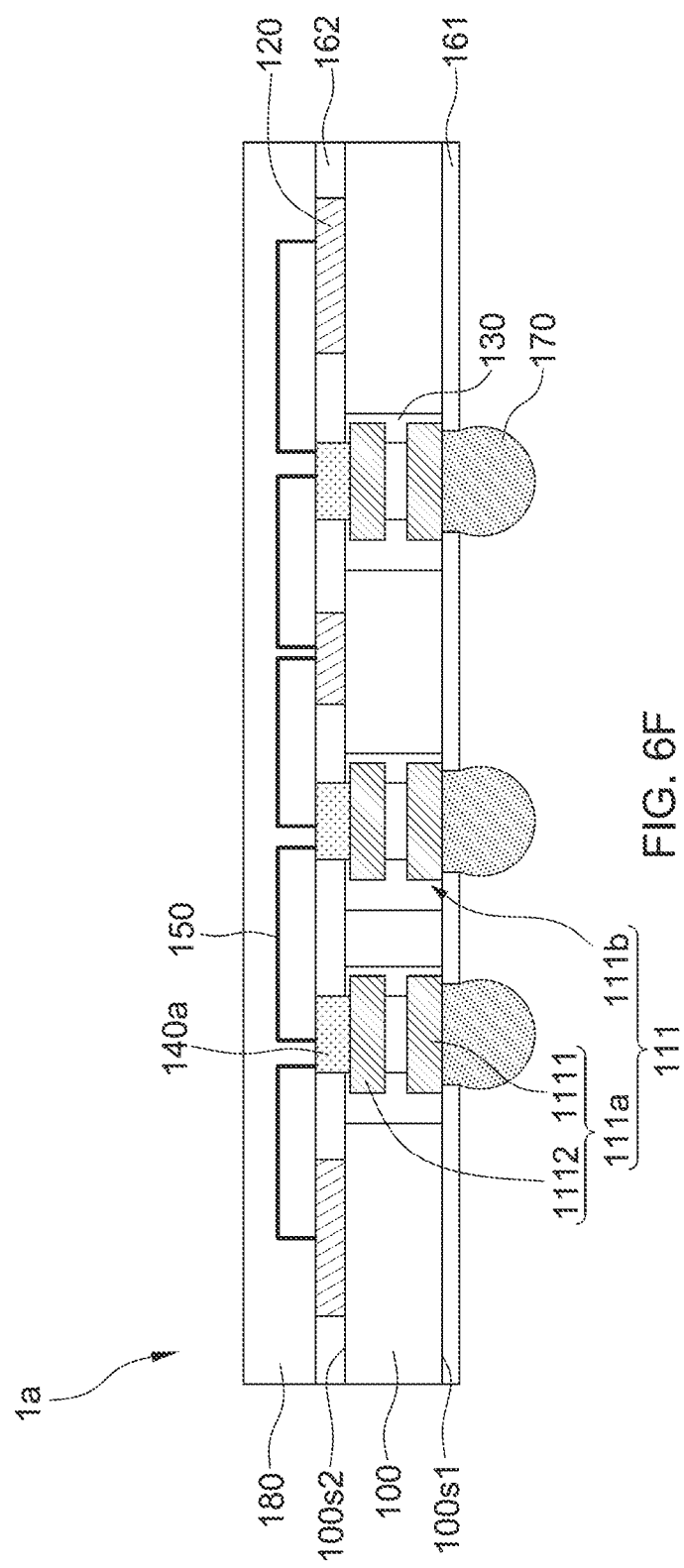

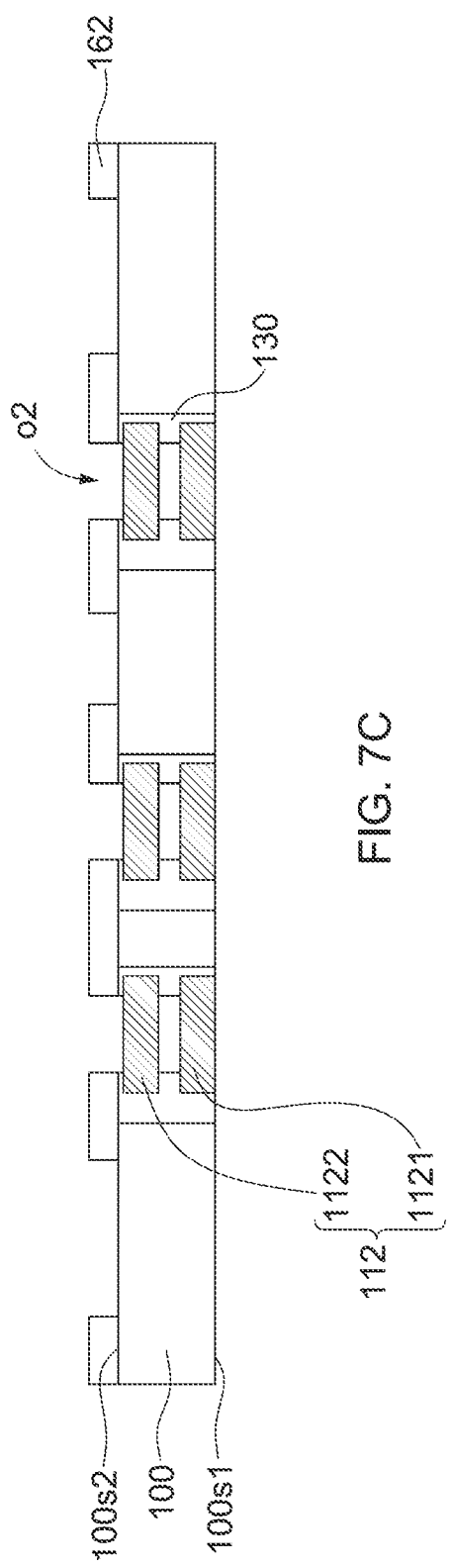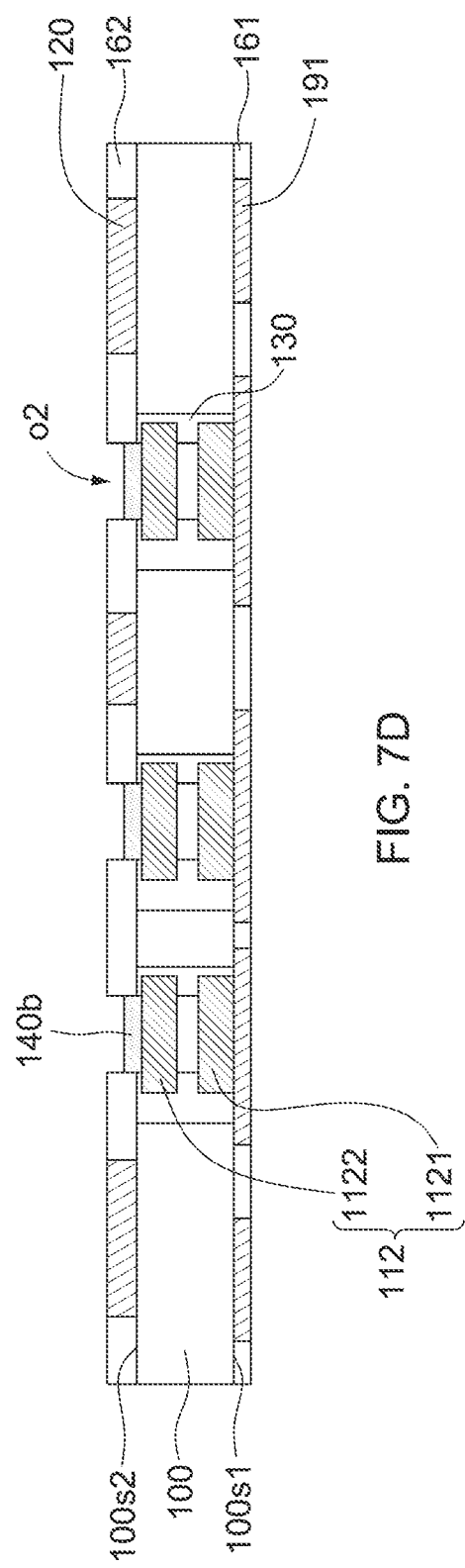

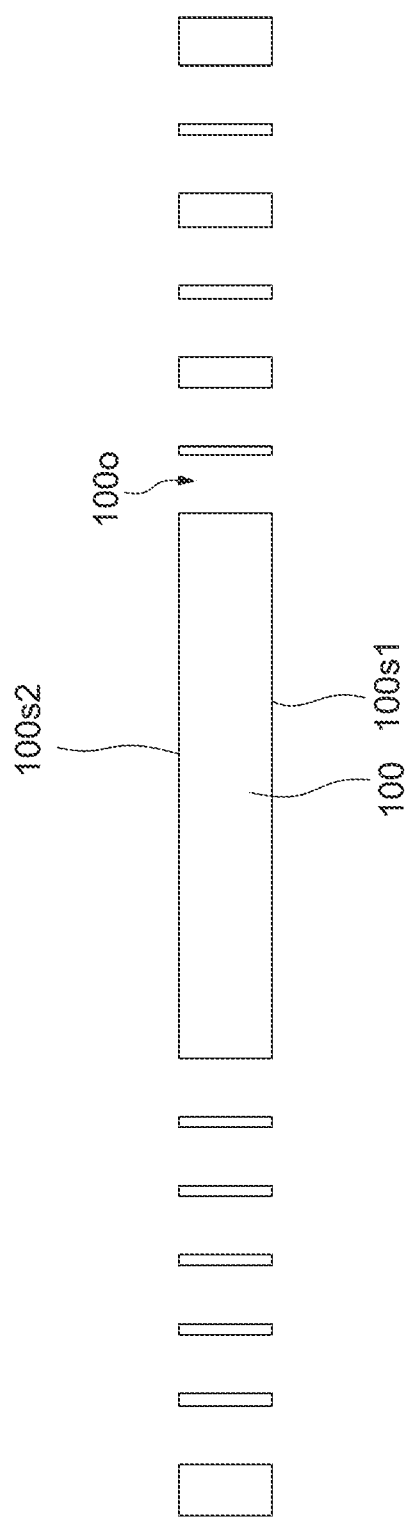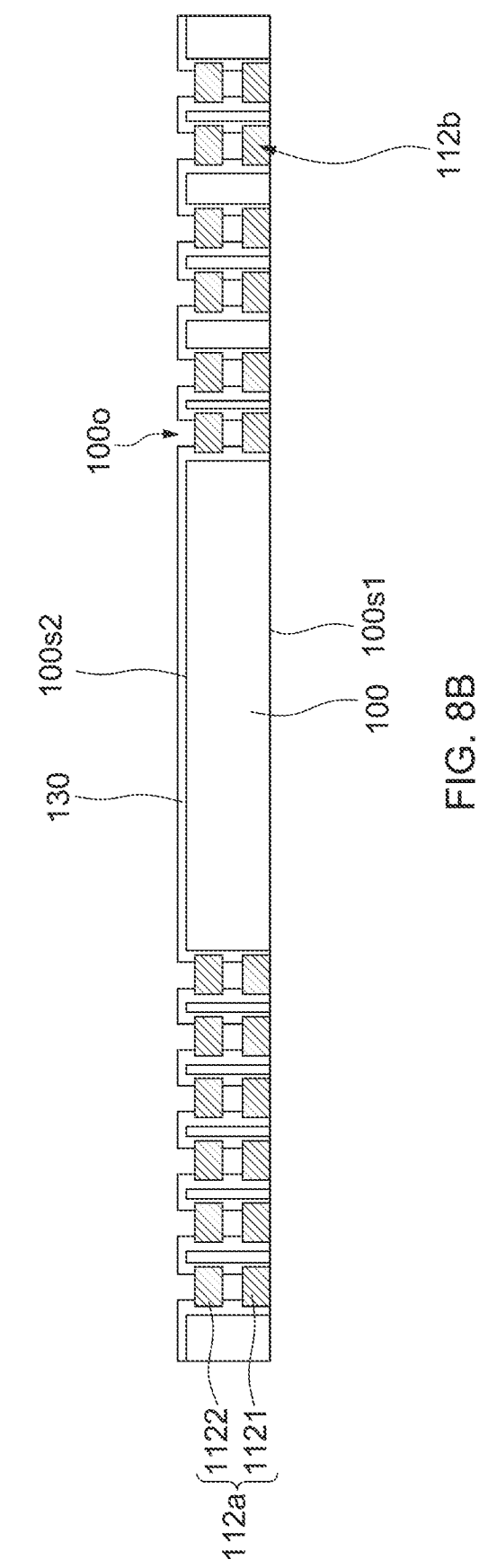

SEMICONDUCTOR PACKAGE STRUCTURE AND METHOD FOR MANUFACTURING THE SAME

BACKGROUND

1. Field of the Disclosure

The present disclosure relates to a semiconductor package structure, and particularly to a semiconductor package structure including passive elements.

2. Description of the Related Art

System in package (SiP) has been widely used to assemble passive devices and chips into a single package structure. However, most passive devices (e.g., capacitor, resistor and inductor) are quite large and it is difficult to make a semiconductor package structure thinner and smaller. Therefore, a new semiconductor package structure is required.

SUMMARY

In some embodiments, a semiconductor package structure includes a substrate and a first passive device. The substrate has a first surface and a second surface opposite to the first surface. The first passive device includes a first terminal and a second terminal, wherein the first terminal is closer to the first surface than to the second surface, and the second terminal is closer to the second surface than to the first surface.

In some embodiments, a semiconductor package structure includes a substrate, a first passive device, a first conductive element and a first passive device. The substrate has a first surface and a second surface. The first passive device is embedded in the substrate. The first conductive element is disposed on the first surface of the substrate. The device is disposed on the second surface of the substrate. The first conductive element is electrically connected to the device through the first passive device.

In some embodiments, a method of manufacturing a semiconductor package structure includes: providing a substrate having a first surface and a second surface; embedding a first passive device in the substrate, wherein the first passive device has a first terminal and a second terminal opposite to the first terminal, and the first terminal is closer to the first surface than the second terminal is; and providing a second device, wherein the second device is electrically connected to the first passive device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 6A, FIG. 6B, FIG. 6C, FIG. 6D, FIG. 6E and FIG. 6F illustrate various stages of a method for manufacturing a semiconductor package structure in accordance with some embodiments of the present disclosure.

FIG. 7A, FIG. 7B, FIG. 7C, FIG. 7D and FIG. 7E illustrate various stages of a method for manufacturing a semiconductor package structure in accordance with some embodiments of the present disclosure.

FIG. 8A, FIG. 8B, FIG. 8C and FIG. 8D illustrate various stages of a method for manufacturing a semiconductor package structure in accordance with some embodiments of the present disclosure.

DETAILED DESCRIPTION

Figure 1:
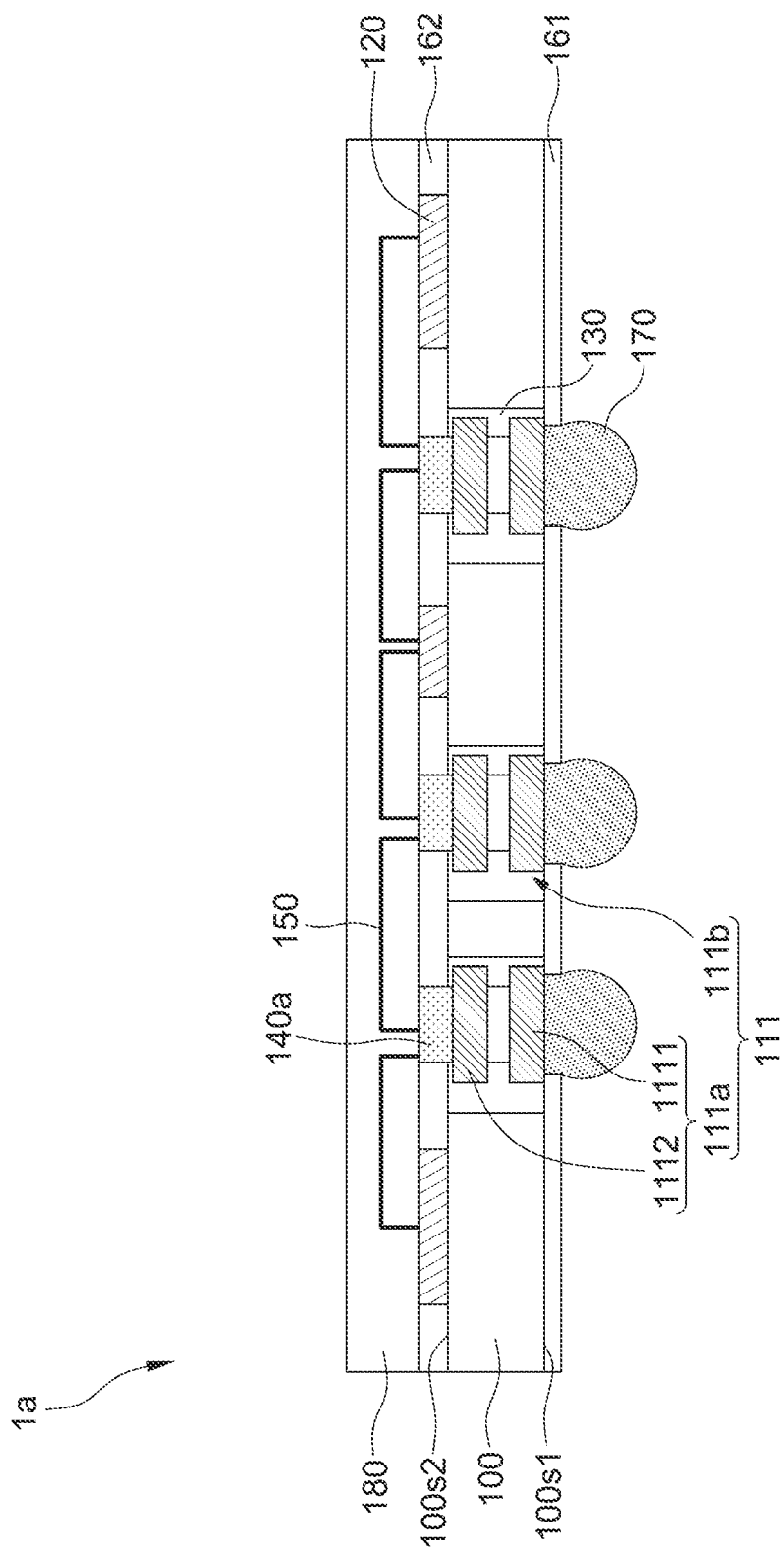
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein the term "active surface" may refer to a surface of an electronic component on which contact terminals such as contact pads are disposed.

FIG. 1 illustrates a cross-sectional view of an example of a semiconductor package structure 1*a* according to some embodiments of the present disclosure. In some embodiments, the semiconductor package structure 1*a* may include a substrate 100 and one or more devices 111, such as the device 111*a* and device 111*b*.

The substrate 100 may include, for example, a core substrate. The core substrate may include Prepreg (PP), Ajinomoto build-up film (ABF), an optically cured material or other suitable materials. In some embodiments, a resin material used in the core substrate may be a fiber-reinforced resin so as to strengthen the core substrate, and the reinforcing fibers may be, without limitation to, glass fibers or Kevlar fibers (aramid fibers). The substrate 100 may be a multi-layered substrate comprising plated thru holes and or vias for forming electrical circuits, all of which have been omitted for simplicities sake. The substrate 100 may have a surface 100s1 (or a bottom surface) and a surface 100s2 (or a top surface) opposite to the surface 100s1. The substrate 100 may define a plurality of openings penetrating from the surface 100s1 to the surface 100s2 of the substrate 100. The substrate 100 has a thickness in a direction substantially perpendicular to the surface 100s1, and a width of the surface 100s1 may be larger than the thickness of the substrate 100.

In some embodiments, the device 111 may be embedded in the substrate 100. The device 111 may be disposed within the opening defined by the substrate 100. In some embodiments, the device 111 may be configured to, for example, transmit signal(s) through a path along a substantially vertical direction, which may be defined as a direction substantially parallel to the normal direction of the surface 100s2 of the substrate 100. The device 111 may include, for example, a passive device or another suitable device. The passive device may include, for example, a capacitor, an inductor, a resistor, a filter, a diplexer or another suitable device. In some embodiments, the device 111 may include a capacitor, which may have two or more terminals.

The device 111 (e.g., the device 111a) may include a terminal 1111 and a terminal 1112 opposite to the terminal 1111. In some embodiments, the terminal 1111 and the terminal 1112 may be arranged along a substantially vertical direction. For example, the terminal 1111 of the device 111 may be proximal to the surface 100s1 of the substrate 100, and the terminal 1112 of the device 111 may be proximal to the surface 100s2 of the substrate 100. The terminal 1111 may be exposed from the surface 100s1. The terminal 1112 may be exposed from the surface 100s2. The terminal 1111 is closer to the surface 100s1 than to the surface 100s2, and the terminal 1112 is closer to the surface 100s2 than to the surface 100s1. The terminal 1111 is closer to the surface 100s1 than the terminal 1112 is.

In some embodiments, the terminal 1111 or the terminal 1112 may be electrical conductive terminals, which may include a conductive material, such as metal, metal alloy or another suitable material. In some embodiments, the material of the terminal 1111 or the terminal 1112 may include tin, tin alloy, copper, copper alloy, nickel, nickel alloy or other metal or metal alloys. In some embodiments, the terminal 1111 or the terminal 1112 may include tin, which has a relatively low cost, and therefore advancing in mass manufacturing of the semiconductor package structure 1a.

In some embodiments, the semiconductor package structure 1a may further include conductive element(s) 120. The conductive element 120 may be disposed on the surface 100s2 of the substrate 100. The conductive element 120 may serve as, for example, a conductive pad, a conductive trace, a conductive wire or other suitable electrical conductors. The conductive element 120 may include one or more stacked conductive layers. For example, the conductive element 120 may include a first conductive layer made of copper and a second conductive layer made of gold stacked on the first conductive layer; alternatively, the first conductive layer may be made of nickel, and the second conductive layer may be made of gold, and the material of the conductive element 120 is not intended to be limiting.

In some embodiments, the semiconductor package structure 1a may further include dielectric layer(s) 130. The dielectric layer 130 may be disposed within the openings defined by the substrate 100. The dielectric layer 130 may surround the device 111. In some embodiments, the dielectric layer 130 may cover a portion of the top surface of the terminal 1112, and define an opening to expose the top surface of the terminal 1112. In some embodiment, the bottom surface of the dielectric layer 130 may be substantially coplanar with the bottom surface of the terminal 1111 of the device 111. The dielectric layer 130 may include, for example, solder resist or another suitable material. The dielectric layer 130 may include optical sensitive material, which may be patterned by a lithography operation.

In some embodiments, the semiconductor package structure 1a may further include conductive paste(s) 140a. The conductive paste 140a may be disposed on the device 111. For example, the conductive paste 140a may be disposed on the terminal 1112 of the device 111. The conductive paste 140a may be in contact with the device 111. In some embodiments, a top surface of the conductive paste 140a may be at an elevation substantially the same as or lower than that of the conductive element 120. The top surface of the conductive paste 140a may be coplanar with or recessed from the top surface of the dielectric layer 162. The conductive paste 140a may include, for example, a solder material or other suitable materials. For example, the conductive paste 140a may include metal, alloy or other suitable materials. The conductive paste 140a may include tin, gold, nickel, or alloys of gold and tin or alloys of silver and tin.

In some embodiments, the semiconductor package structure 1a may further include conductive wire(s) 150. The conductive paste 140a may be disposed between the device 111 and the conductive wire 150. The conductive wire 150 may be electrically connected to the device 111 through the conductive paste 140a. The conductive wire 150 may be disposed on the surface 100s2 of the substrate 100. The conductive wire 150 may include, for example, a wire bond to electrically connect different device(s) and/or conductive element(s). For example, the conductive wire 150 may electrically connect the conductive element 120 and the conductive paste 140a. In some embodiments, the device 111a may be electrically connected to the device 111b through the conductive wire 150.

In some embodiments, the semiconductor package structure 1a may further include a dielectric layer 161. The dielectric layer 161 may be disposed on the surface 100s1 of the substrate 100. The dielectric layer 161 may define a plurality of openings which expose the terminal 1111 of the device 111.

In some embodiments, the semiconductor package structure 1a may further include a dielectric layer 162. The dielectric layer 162 may be disposed on the surface 100s2 of the substrate 100. The dielectric layer 162 may define a plurality of openings which expose the terminal 1112 of the device 111 and the conductive element(s) 120. The material of the dielectric layer 162 may include optical-sensitive material, which may be patterned by a lithography operation. The material of the dielectric layer 162 may include other materials, such as resin.

In some embodiments, the semiconductor package structure 1a may further include conductive element(s) 170. The conductive element 170 may serve as, for example, an electrical connector to electrically connect the semiconductor package structure 1a and other electronic component(s) (not shown), such as a printed circuit board (PCB) or other electronic components. The conductive element 170 may be disposed on the surface 100s1 of the substrate 100. The conductive element 170 may include, for example, a solder ball, which may include lead or may be leadfree (e.g., including one or more materials such as alloys of gold and tin solder or alloys of silver and tin solder). The conductive element 170 may be electrically connected to the device 111.

In some embodiments, the semiconductor package structure 1a may further include a package body 180. The package body 180 may be disposed on the surface 100s2 of the substrate 100. The package body 180 may cover the dielectric layer 162. The package body 180 may be made of molding material that may include, for example, a Novolac-based resin, an epoxy-based resin, a silicone-based resin, or other another suitable encapsulant. Suitable fillers may also be included, such as powdered $SiO_2$.

In a conventional semiconductor package structure, the terminals of a passive device embedded in a substrate are arranged in a substantially horizontal direction, which may provide a horizontal conductive path to electrically connect different conductive elements. Further, a redistribution layer is used to electrically connect the terminals of the passive device embedded in the substrate. However, such a combination of a passive device and a RDL may cause a high cost, and the size of such a semiconductor package structure is increased. In the embodiments of the present disclosure, the passive device, such as the device 111, may be embedded in the substrate 100, and have two terminals arranged along a vertical direction, which may provide a vertical conductive path to connect conductive elements on different sides of the substrate 100. Further, the conductive wire 150 may be used to replace an RDL and electrically connect the device 111 and other devices. Therefore, the embodiments of the present disclosure can assist in providing a relatively small semiconductor package structure and a relatively low cost for manufacturing semiconductor package structures.

Figure 2:
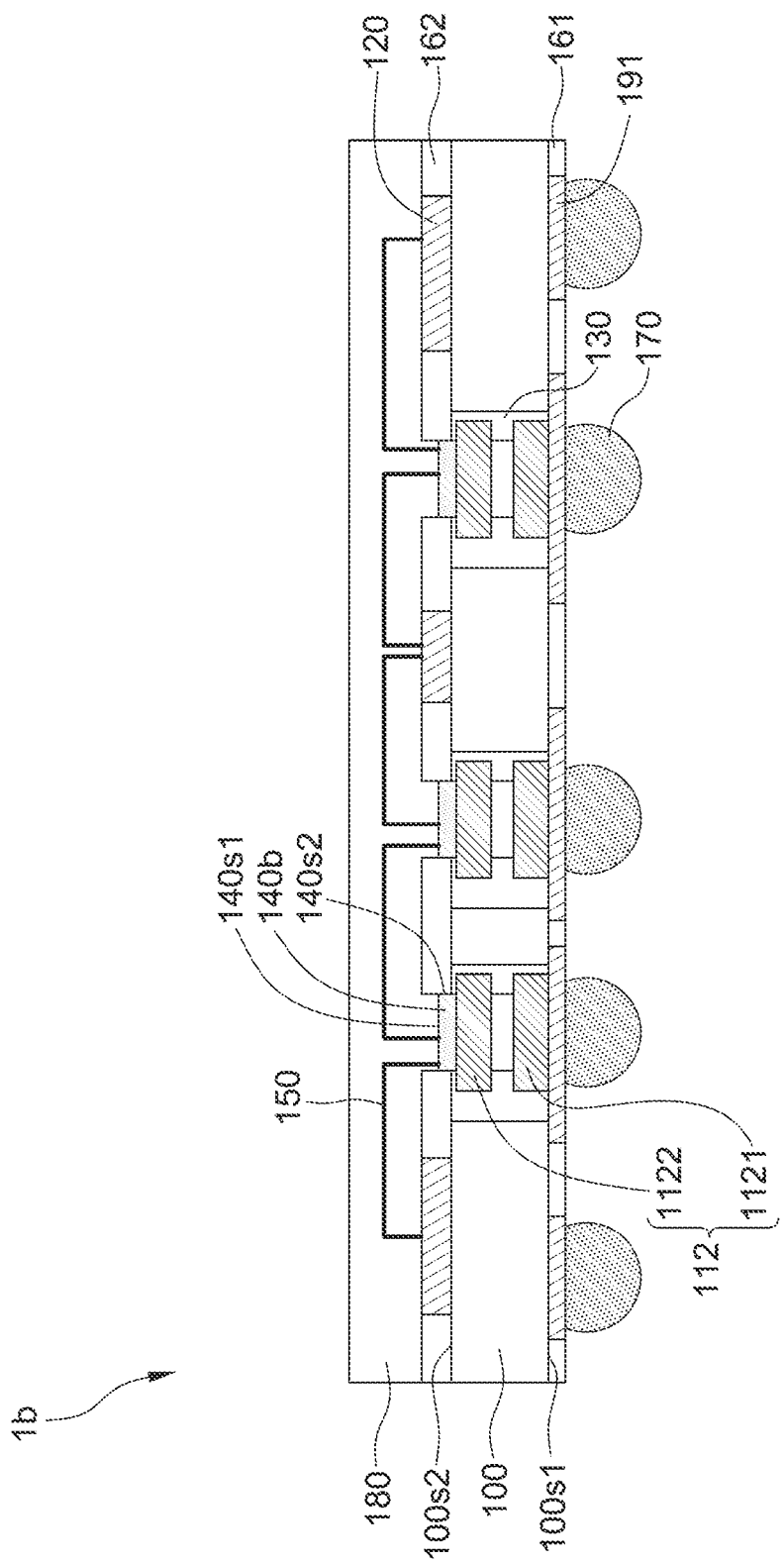
FIG. 2 illustrates a cross-sectional view of an example of a semiconductor package structure according to some embodiments of the present disclosure.

FIG. 2 illustrates a cross-sectional view of an example of a semiconductor package structure 1b according to some embodiments of the present disclosure. The semiconductor package structure 1b of FIG. 2 has a similar structure to that of the semiconductor package structure 1a of FIG. 1 with one of differences that the semiconductor package structure 1b may include a device 112.

The device 112 may be embedded in the substrate 100. The device 112 may include a terminal 1121 and a terminal 1122. In some embodiments, the terminal 1121 and the terminal 1122 may be arranged at a substantially vertical direction. For example, the terminal 1121 of the device 112 may be proximal to the surface 100s1 of the substrate 100, and the terminal 1122 of the device 112 may be proximal to the surface 100s2 of the substrate 100.

In some embodiments, the terminal 1121 or the terminal 1122 may include a conductive material, such as metal, metal alloy or another suitable material. In some embodiments, the terminal 1121 or the terminal 1122 may include copper, which has a relatively high melt point. In this embodiment, the opening of the dielectric layer 130 may be formed by, for example, an energy-beam. The wavelength, power or power intensity of the energy-beams can be adjusted depending on the materials. For example, the energy-beam may include laser or other suitable energy-beams. In some embodiments, the opening of the dielectric layer 130 may be formed by a laser drilling operation. The laser drilling operation may form a relatively small opening, and may assist in manufacturing a smaller semiconductor package structure. In some embodiments, the sidewall of the dielectric layer 130 defining the opening may have a relatively great roughness due to laser drilling operation. In some embodiments, the roughness of the sidewall of the dielectric layer 130 defining the opening is greater than that of the top surface of the dielectric layer 130. In some embodiments, the sidewall of the dielectric layer 162 defining the opening may have a relatively great roughness due to laser drilling operation. In some embodiments, the roughness of the sidewall of the dielectric layer 162 defining the opening is greater than that of the top surface of the dielectric layer 162. In other some embodiments, the opening of the dielectric layer 130 may be formed by, for example, a lithography operation.

In some embodiments, the semiconductor package structure 1b may further include a conductive wire-bonding-protection layer 140b. The conductive wire-bonding-protection layer 140b may be disposed in the opening defined by the dielectric layer 130 and the dielectric layer 162. The conductive wire-bonding-protection layer 140b may be electrically connected to the device 112. In some embodiments, the terminal 1122 of the device 112 may be in contact with the conductive wire-bonding-protection layer 140b. The conductive wire-bonding-protection layer 140b may be disposed between the device 112 and the conductive wire 150. The conductive wire-bonding-protection layer 140b may be configured to serve as a protection layer to protect the device 112 from damage during the formation of the conductive wire 150. In some embodiments, a top surface of the conductive wire-bonding-protection layer 140b may be at an elevation lower than that of the conductive element 120. The top surface of the conductive wire-bonding-protection layer 140b may be recessed from the top surface of the dielectric layer 162. The conductive wire-bonding-protection layer 140b may include, for example, a metal finish layer or other suitable conductive protection layer. The metal finish layer may include metal, alloy or a combination thereof. For example, the metal finish layer may include an alloy of nickel and gold. The conductive wire-bonding-protection layer 140b may have a surface 140s1 (or a top surface) and a surface 140s2 (or a side surface) adjacent to the surface 140s1. In some embodiments, the roughness of the surface 140s2 of the conductive wire-bonding-protection layer 140b may be greater than the roughness of the surface 140s1 of the conductive wire-bonding-protection layer 140b.

In some embodiments, the semiconductor package structure 1b may further include a conductive layer 191. The conductive layer 191 may be disposed on the surface 100s1 of the substrate 100. The conductive layer 191 may be embedded in the dielectric layer 161. The conductive layer 191 may be configured to electrically connect the device 112 and the conductive element 170. The conductive layer 191 may include one or more stacked metal layer(s) or alloy layer(s).

Figure 3:
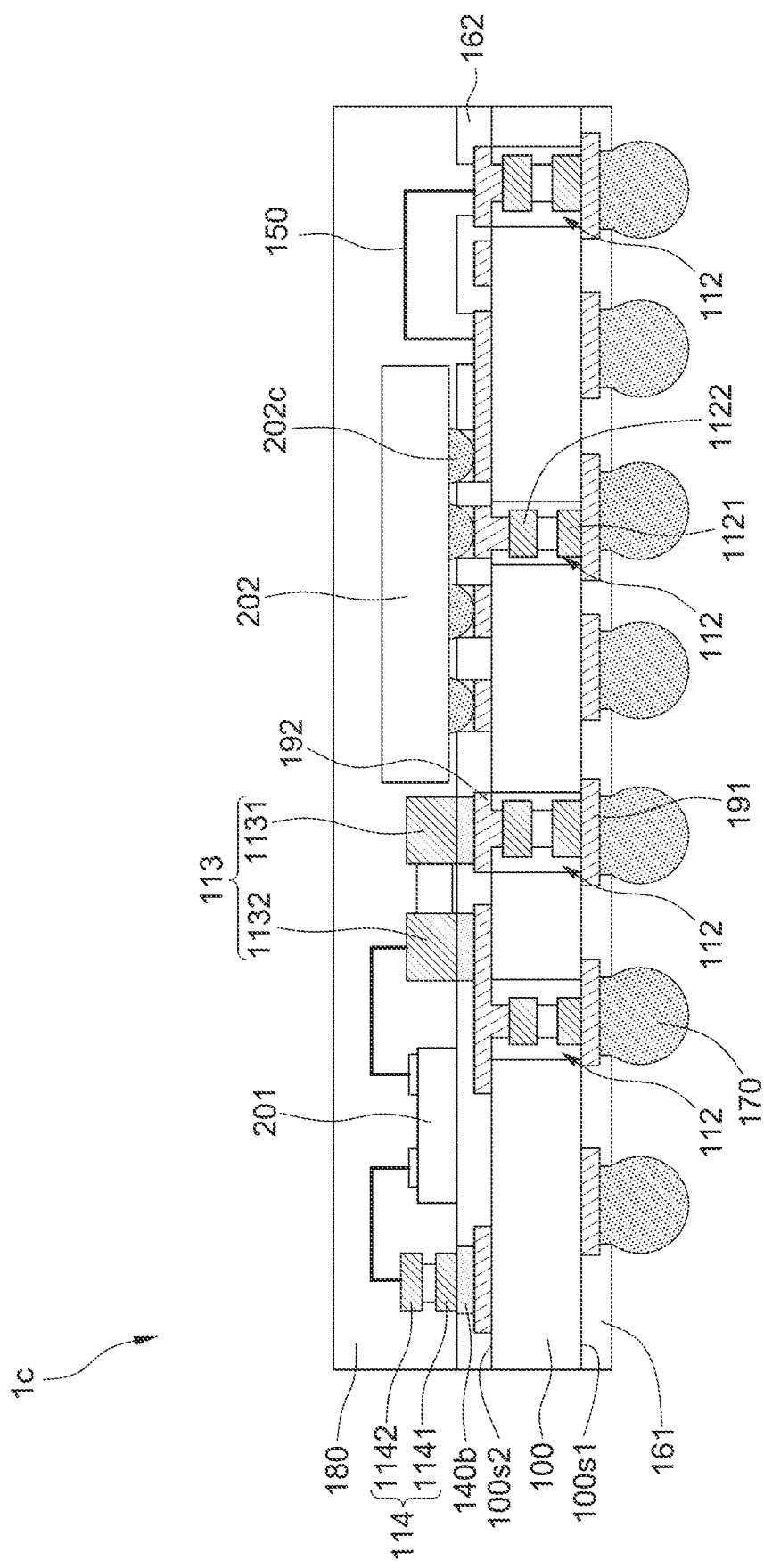
FIG. 3 illustrates a cross-sectional view of an example of a semiconductor package structure according to some embodiments of the present disclosure.

FIG. 3 illustrates a cross-sectional view of an example of a semiconductor package structure 1c according to some embodiments of the present disclosure. The semiconductor package structure 1c of FIG. 3 has a similar structure to that of the semiconductor package structure 1b of FIG. 2 with one of differences that the semiconductor package structure 1c may include a device 113 and a device 114.

In some embodiments, the semiconductor package structure 1c may include a device 114. In some embodiments, the device 114 may be disposed on the surface 100s2 of the substrate 100. The device 114 may be covered by the package body 180. The device 114 may include a passive device, such as a capacitor, an inductor, a resistor, a filter, a diplexer or another suitable device. In some embodiments, the device 114 may include a capacitor. The terminal 1141 of the device 114 may be proximal to or face the surface 100s2 of the substrate 100, and the terminal 1142 of the device 114 may be far from or face away the surface 100s2 of the substrate 100. In some embodiments, the device 114 may be the same as or similar to the device 111. In some embodiments, the terminal 1141 and the terminal 1142 may be arranged at a substantially vertical direction, which is substantially parallel to the arrangement of the terminal 1121 and the terminal 1122 of the device 112.

In some embodiments, the semiconductor package structure 1c may include a device 113. The device 113 may be disposed on the surface 100s2 of the substrate 100. The device 113 may include a passive device, such as a capacitor, an inductor, a resistor, a filter, a diplexer or another suitable device. In some embodiments, the device 113 may include a capacitor. The device 113 may have a terminal 1131 and a terminal 1132 opposite to the terminal 1132. The device 113 may be the same as or similar to the device 114 except for the arrangement of the terminal 1131 and the terminal 1132. In some embodiments, the terminal 1131 and the terminal 1132 may be arranged at a substantially horizontal direction, which is substantially perpendicular to the arrangement of the terminal 1141 and the terminal 1142 of the device 114. For example, both the terminal 1131 and the terminal 1132 may be disposed on the surface 100s2 of the substrate 100 and at the same elevation. In some embodiments, the device 113 may be electrically connected to the device 112. In some embodiments, the terminal 1131 of the device 113 may be located directly above the device 112.

In some embodiments, the semiconductor package structure 1c may include a conductive layer 192. The conductive layer 192 may be disposed on the surface 100s2 of the substrate 100. The conductive layer 192 may be embedded in the dielectric layer 162. The conductive layer 192 may serve as, for example, a pattern trace or a redistribution layer for electrically connecting conductive element(s) and/or device(s).

In some embodiments, the semiconductor package structure 1c may include a device 201. The device 201 may be disposed on the surface 100s2 of the substrate 100. The device 201 may be covered by the package body 180. The device 201 may include an active device, such as a semiconductor die or a chip. In some embodiments, the device 201 may be electrically connected to the device 114 through the conductive wire 150. In some embodiments, the device 201 may be electrically connected to the device 113 through the conductive wire 150. In some embodiments, the active surface of the device 201 may face away from the surface 100s2 of the substrate 100. In some embodiments, the device 201 may be in contact with the conductive wire 150. For example, the conductive wire 150 may be in contact with the terminals (e.g., pads) of the device 201. In some embodiments, the device 201 may be electrically connected to the device 112 through the device 113. In some embodiments, the device 201 may be electrically connected to the device 112 through the conductive wire 150. In some embodiments, the device 201 may be electrically connected to the device 112 through the conductive layer 192. For example, the device 201 may be electrically connected to the device 112 through the conductive wire 150, the device 113 and the conductive layer 192. In some embodiments, the device 201 may be electrically connected to the device 112 through the terminals 1131 and 1132 of the device 113. In some embodiments, the device 201 may be electrically connected to the device 112 through one of the terminal (e.g., the terminal 1132) of the device 113 and without through the other terminal (e.g., the terminal 1131).

In some embodiments, the semiconductor package structure 1c may include a device 202. The device 202 may be disposed on the surface 100s2 of the substrate 100. The device 202 may be covered by the package body 180. The device 202 may include an active device, such as a semiconductor die or a chip. In some embodiments, the device 202 may include a flip chip. For example, the active surface of the device 202 may face the surface 100s2 of the substrate 100, and the device 202 may be fixed on the substrate 100 through electrical connectors, such as solder balls, disposed on the active surface of the device 202. In this embodiments, the device 202 may be electrically connected to the device 112 through the electrical connectors 202c, such as solder conductors, and without through the conductive wire 150. In some embodiments, the device 202 may be electrically connected to the conductive wire 150 through the conductive layer 192. In some embodiments, the device 202 may be electrically connected to the device 112 through the conductive wire 150. In some embodiments, the device 202 may be spaced apart from the conductive wire 150. In some embodiments, the device 202 may be electrically connected to the device 112 through the conductive layer 192 and the conductive wire 150.

In this embodiment, the semiconductor package structure 1c integrate the active device (e.g., the device 201 and the device 202) and the passive device (e.g., the device 114, the device 112 and the device 113). The device 112 may provide a substantially vertical conductive path for electrically connecting the active device and other electronic components (not shown), which may reduce the size of the semiconductor package structure 1c.

Figure 4:
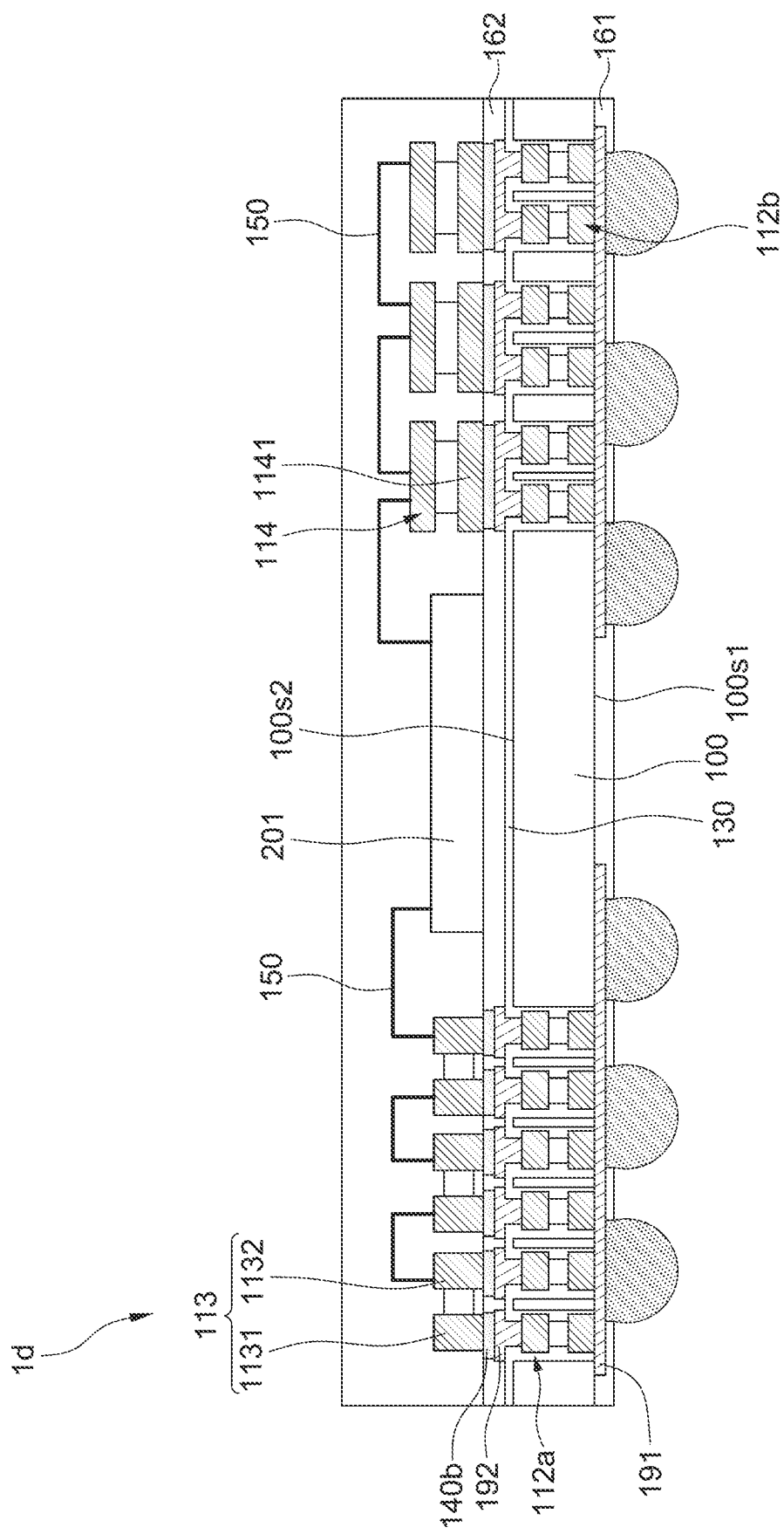
FIG. 4 illustrates a cross-sectional view of an example of a semiconductor package structure according to some embodiments of the present disclosure.

FIG. 4 illustrates a cross-sectional view of an example of a semiconductor package structure 1d according to some embodiments of the present disclosure.

The semiconductor package structure 1d may include a plurality of devices 112a. The device 112a may be the same as or similar to the device 112. In some embodiments, the devices 112a may be electrically connected to each other in parallel. The device 112a may be electrically connected to each other through one or more devices 113. The devices 113 may be electrically connected to each other through the conductive wire(s) 150. The terminal 1131 of the device 113 may vertically overlap one of the devices 112a, and the terminal 1132 of the device 113 may vertically overlap another device 112a. The device 112a may be electrically connected to the device 113 in series. The device 112b may be electrically connected to the device 114 in series. Further, one of the devices 112a may be electrically connected to the device 113 in series, and another one of the devices 112a may be electrically connected to the same device 113 in series. Further, one of the devices 112b may be electrically connected to the device 114 in series, and another one of the devices 112b may be electrically connected to the same device 114 in series.

The semiconductor package structure 1d may include a plurality of devices 112b. The device 112b may be the same as or similar to the device 112. In some embodiments, the devices 112b may be electrically connected to each other in parallel. The devices 112b may be electrically connected to each other through one or more device(s) 114. The device 114 may be electrically connected to each other through the conductive wire(s) 150. The terminal 1141 of the device 114 may vertically overlap two or more devices 112b.

In some embodiments, the device 201 may be electrically connected to the device 112a through the device 113. In some embodiments, the device 201 may be electrically connected to the device 112b through the device 114.

In this embodiment, the plurality of passive devices (e.g., the devices 112a and the devices 112b) may be embedded in the substrate 100 and electrically connected to each other in parallel, which may reduce the size of the semiconductor package structure 1d.

Figure 5:
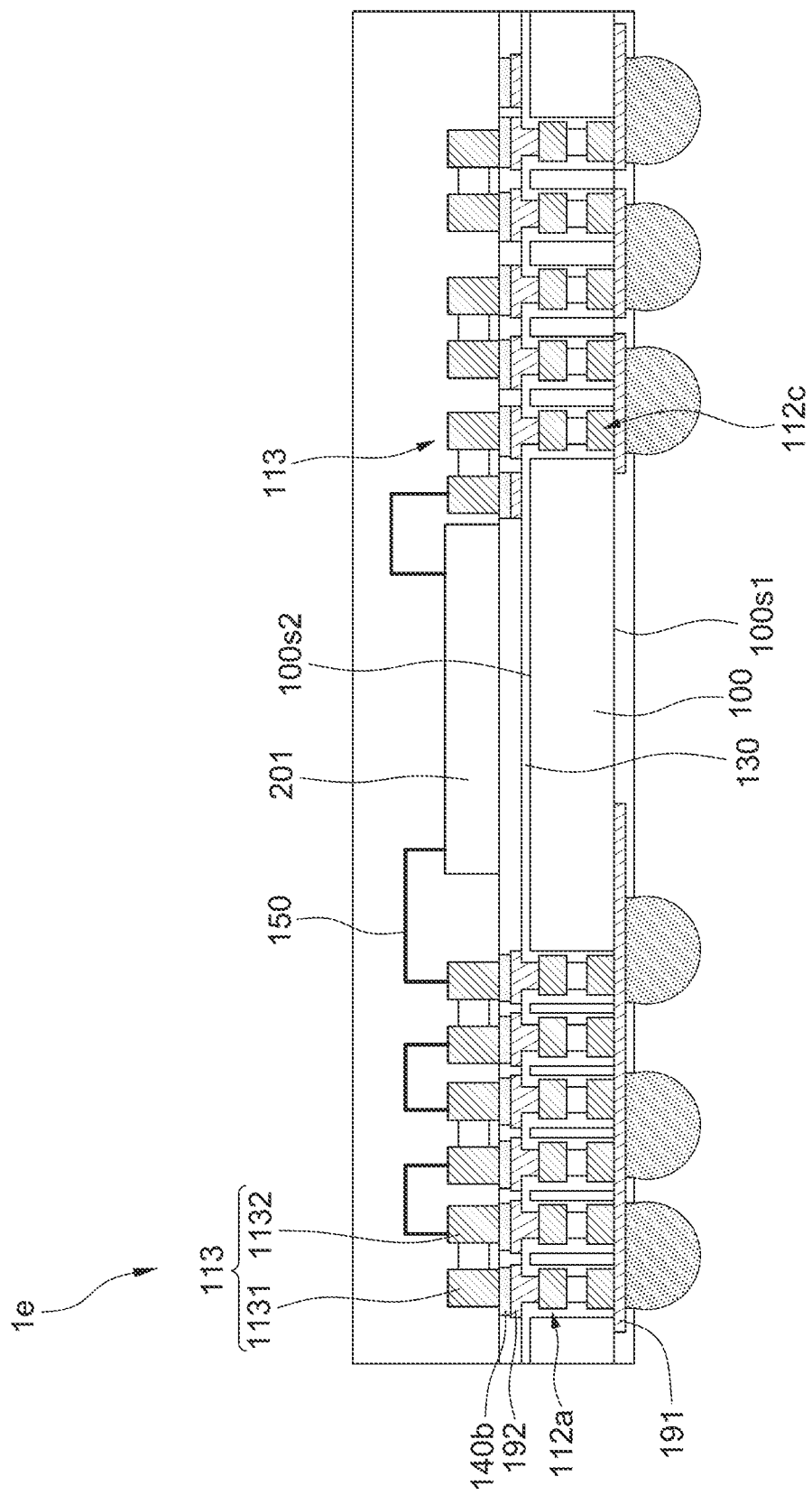
FIG. 5 illustrates a cross-sectional view of an example of a semiconductor package structure according to some embodiments of the present disclosure.

FIG. 5 illustrates a cross-sectional view of an example of a semiconductor package structure 1e according to some embodiments of the present disclosure.

The semiconductor package structure 1e may include a plurality of devices 112c. The device 112c may be the same as or similar to the device 112. In some embodiments, the devices 112c may be electrically connected to each other in series. In this embodiment, the conductive layer 191 may have multiple segments, and every segment of the conductive layer 191 may be in contact with two terminals of two different devices 112b. The devices 112c may be electrically connected to each other through one or more devices 113. The device 113 may electrically connected to the device 112c in series.

In some embodiments, the device 201 may be electrically connected to the device 112c through the device 113. In this embodiment, the plurality of passive devices (e.g., the devices 112c) may be embedded in the substrate 100 and electrically connected to each other in series, which may reduce the size of the semiconductor package structure 1e.

FIG. 6A, FIG. 6B, FIG. 6C, FIG. 6D, FIG. 6E and FIG. 6F illustrate various stages of a method for manufacturing a semiconductor package structure in accordance with some embodiments of the present disclosure.

Figure 6A:
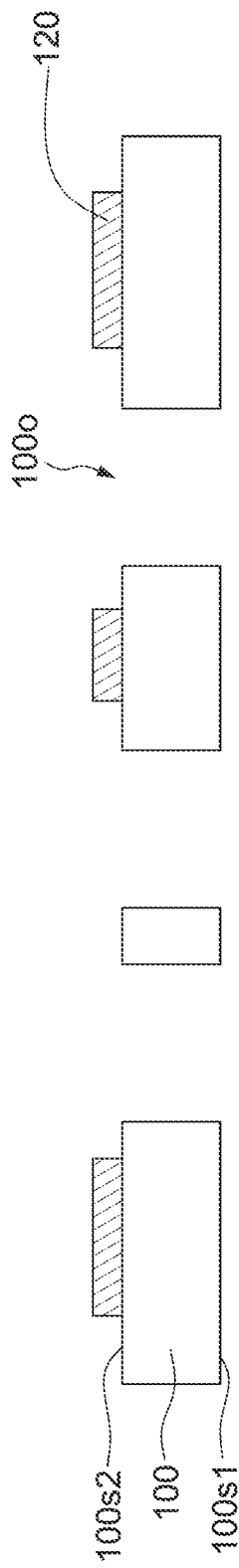

Referring to FIG. 6A, a substrate 100 is provided. The substrate 100 may be disposed on a carrier (not shown), which may be removed in subsequent steps. The substrate 100 may have a surface 100s1 and a surface 100s2 opposite to the surface 100s1. The substrate 100 may be patterned to define a plurality of openings 100o for accommodating device(s). The opening 100o may penetrate the substrate 100 from the surface 100s1 to the surface 100s2. The opening 100o may extend from the surface 100s1 to the surface 100s2 of the substrate 100. Conductive element(s) 120 may be formed on the surface 100s2 of the substrate 100.

Figure 6B:
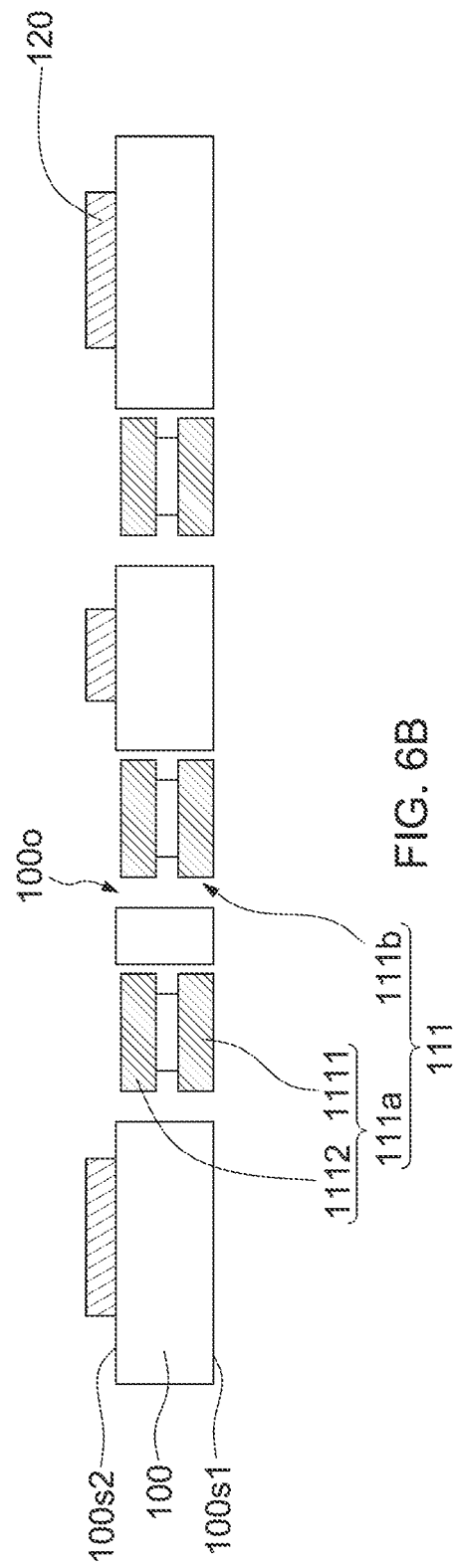

Referring to FIG. 6B, one or more device(s) 111, including the devices 111a and 111b, may be disposed in the openings 100o of the substrate 100. The terminal 1111 and the terminal 1112 of the device 111 may be arranged along a substantially vertical direction, which may be defined as a direction from the surface 100s1 toward the surface 100s2. In some embodiments, the terminal 1121 and the terminal 1122 may include tin.

Referring to FIG. 6C, a dielectric layer 130 and a dielectric layer 162 may be formed. The dielectric layer 130 may cover the device(s) 111. For example, the terminal 1112 of the device 111 may be completely covered by the dielectric layer 130. The dielectric layer 130 may fill the opening(s) 100o of the substrate 100 and surround the device(s) 111. The dielectric layer 162 may be formed to cover the surface 100s2 of the substrate 100, the conductive element(s) 120 and the dielectric layer 130.

Referring to FIG. 6D, a patterning operation may be performed to remove a portion of the dielectric layer 130 and the dielectric layer 162 such that the opening(s) o1 may be formed. The opening(s) o1 may expose the terminal 1112 of the device 111. In some embodiments, the patterning operation may include, for example, a lithography operation, an etching operation and a chemical mechanical polish operation and/or other suitable operations. The etching operation may include a wet etching operation or other suitable operations. In the embodiment where a lithography operation is used, the materials of the dielectric layers 130 and 162 may include optical sensitive material(s), which may be patterned by the lithography operation.

Referring to FIG. 6E, a conductive paste 140a may be formed. The conductive paste 140a may be disposed in the opening o1 to cover the device 111.

Referring to FIG. 6F, a dielectric layer 161, conductive element(s) 170, conductive wire(s) 150, and a package body 180 may be formed such that a semiconductor device structure the same as or similar to the semiconductor device structure 1a shown in FIG. 1 is produced.

FIG. 7A, FIG. 7B, FIG. 7C, FIG. 7D and FIG. 7E illustrate various stages of a method for manufacturing a semiconductor package structure in accordance with some embodiments of the present disclosure.

Figure 7A:
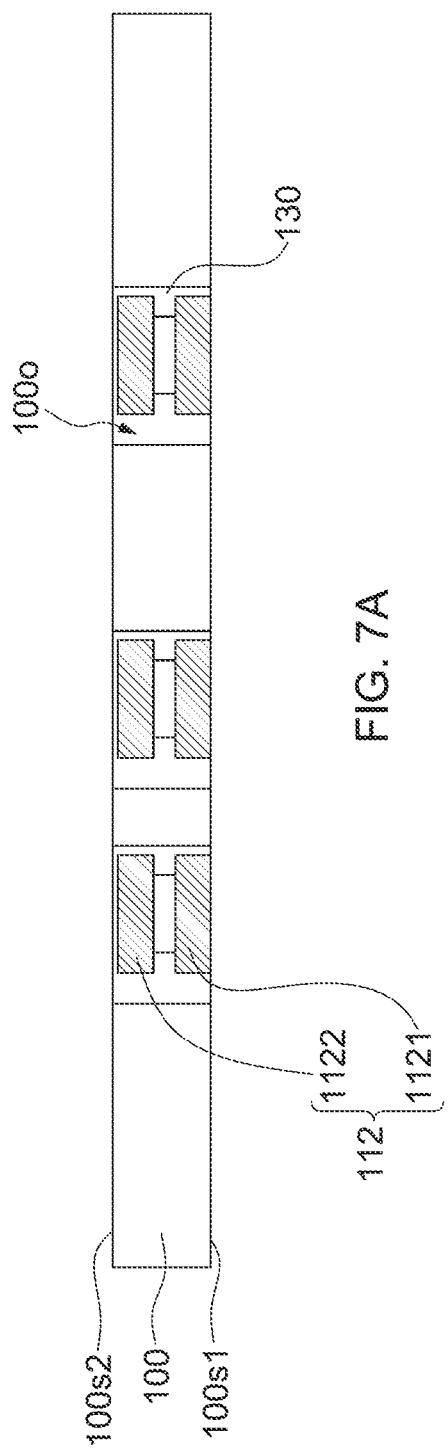

Referring to FIG. 7A, a substrate 100 is provided. The substrate 100 may be disposed on a carrier (not shown), which may be removed in subsequent steps. The substrate 100 may have a surface 100s1 and a surface 100s2 opposite to the surface 100s1. The substrate 100 may be patterned to define a plurality of openings 100o. One or more device(s) 112 may be disposed within the openings 100o of the substrate 100. A dielectric layer 130 may be formed to fill the openings 100o and completely cover the device 112. The terminal 1121 and the terminal 1122 may be arranged along a substantially vertical direction, which may be defined as a direction from the surface 100s1 toward the surface 100s2 of the substrate 100. In some embodiments, the terminal 1121 and the terminal 1122 may include copper.

Figure 7B:
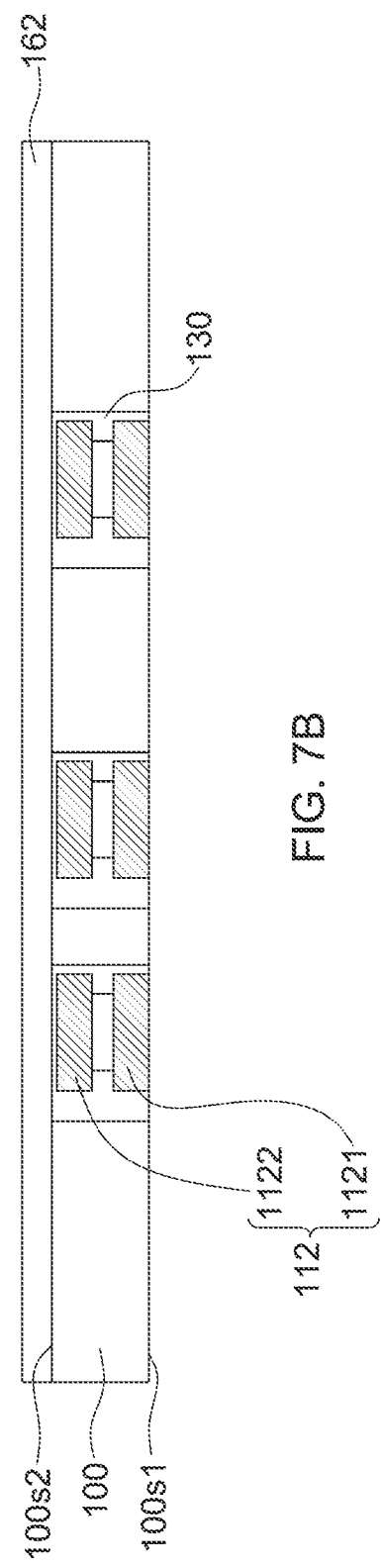

Referring to FIG. 7B, a dielectric layer 162 may be formed to cover the surface 100s2 of the substrate 100 and the dielectric layer 130.

Referring to FIG. 7C, the dielectric layer 162 and the dielectric layer 130 may be patterned to define a plurality of openings o2 to expose the terminal 1122 of the device 112. In some embodiments, the opening o2 may be formed by an energy-beam. The energy-beam may include laser or other suitable energy-beams. In some embodiments, the opening o2 may be formed by a laser drilling operation. The laser drilling operation may assist in forming a relatively small size of the opening o2, which may advance in manufacturing a relatively small semiconductor package structure. In some embodiments the roughness of the sidewall of the dielectric layer 130 defining the opening o2 is greater than that of the top surface of the dielectric layer 130. In some embodiments, the roughness of the sidewall of the dielectric layer 162 defining the opening o2 is greater than that of the top surface of the dielectric layer 162. In other some embodiments, the opening o2 may be formed by a lithography operation.

Referring to FIG. 7D, a conductive element 120, a dielectric layer 161 and a conductive layer 191 may be formed. Further, a conductive wire-bonding-protection layer 140b may be formed in the opening o2 to cover the terminal 1122 of the device 112. The conductive wire-bonding-protection layer 140b may be formed by, for example, an electroplating operation. A roughness of the side surface of the conductive wire-bonding-protection layer 140b may be greater than that of the top surface of the conductive wire-bonding-protection layer 140b. The conductive layer 191 may be formed to be in contact with the terminal 1121 of the device 112. The dielectric layer 161 may be formed and patterned to expose the conductive layer 191.

Figure 7E:
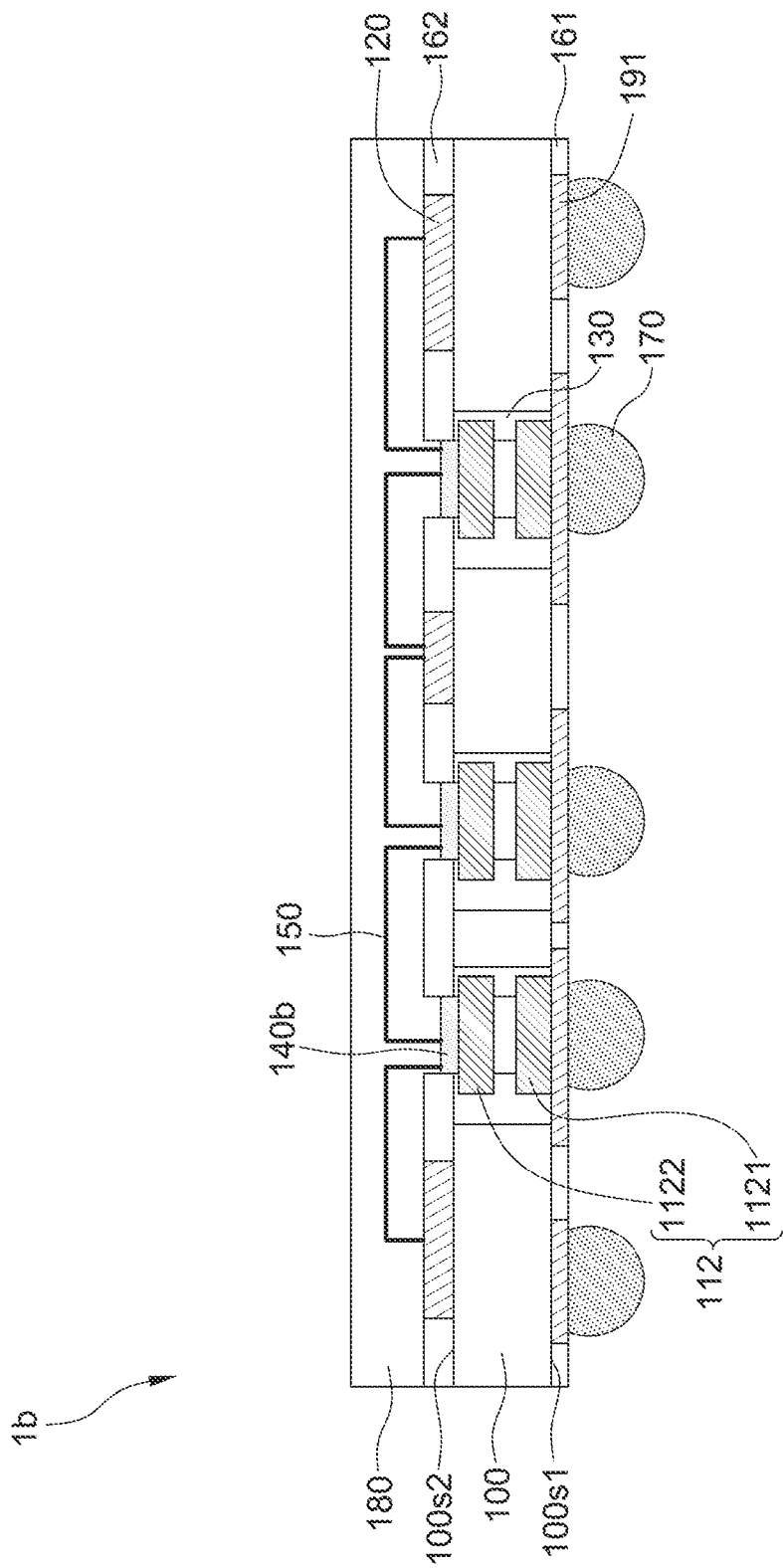

Referring to FIG. 7E, conductive element(s) 170, conductive wire(s) 150, and a package body 180 may be formed such that a semiconductor device structure the same as or similar to the semiconductor device structure 1b shown in FIG. 2 is produced.

FIG. 8A, FIG. 8B, FIG. 8C and FIG. 8D illustrate various stages of a method for manufacturing a semiconductor package structure in accordance with some embodiments of the present disclosure.

Referring to FIG. 8A, a substrate 100 is provided. The substrate 100 may be disposed on a carrier (not shown), which may be removed in subsequent steps. The substrate 100 may have a surface 100s1 and a surface 100s2 opposite to the surface 100s1. The substrate 100 may be patterned to define a plurality of openings 100o. The opening 100o may penetrate the substrate 100 from the surface 100s1 to the surface 100s2.

Referring to FIG. 8B, a plurality of devices 112a and a plurality of devices 112b may be disposed in the openings 100o of the substrate 100. A dielectric layer 130 may be formed within the openings 100o to cover the devices 112a and the devices 112b. The dielectric layer 130 may be patterned to expose a portion of the devices 112a and the devices 112b.

Figure 8C:
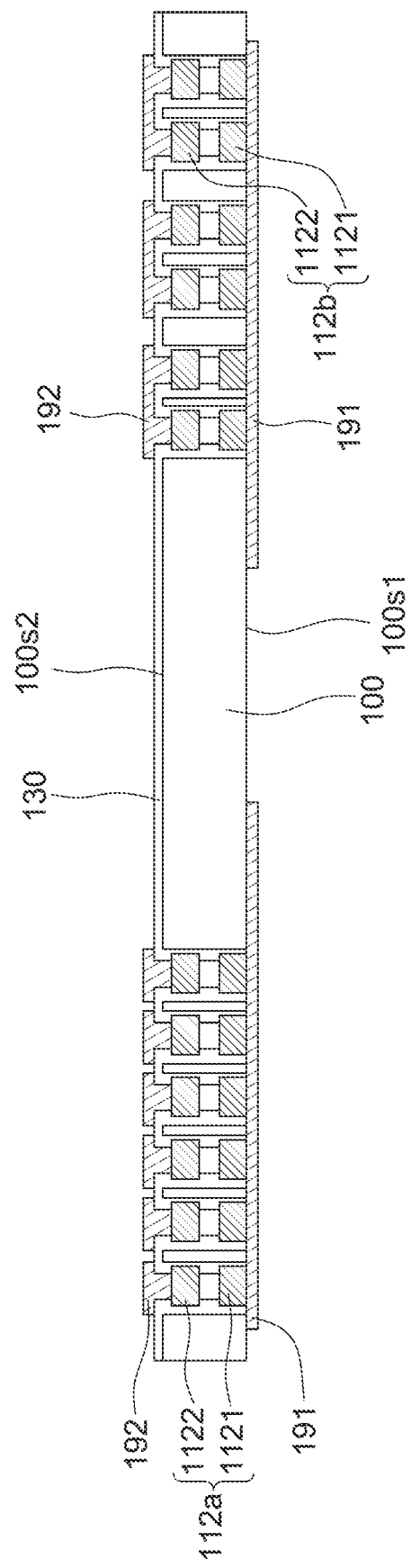

Referring to FIG. 8C, a conductive layer 191 and a conductive layer 192 may be formed. The conductive layer 191 may cover the surface 100s1 of the substrate 100. The conductive layer 191 may be in contact with the terminal 1121 of the device 112a and the device 112b. The conductive layer 192 may cover the surface 100s2 of the substrate 100. The conductive layer 192 may be in contact with the terminal 1122 of the device 112a and the device 112b. In some embodiments, the conductive layer 191 may be in contact with all terminals 1121 of the devices 112a. In some embodiments, the conductive layer 191 may be in contact with all terminals 1121 of the devices 112b. In some embodiments, the conductive layer 192 may be patterned such that the conductive layer 192 may have multiple segments, and every segment of the conductive layer 192 may be in contact with one terminal 1122 of the device 112a. In some embodiments, the conductive layer 192 may be patterned such that the conductive layer 192 may have multiple segments, and every segment of the conductive layer 192 may be in contact with two terminals 1122 of the adjacent devices 112b.

Figure 8D:
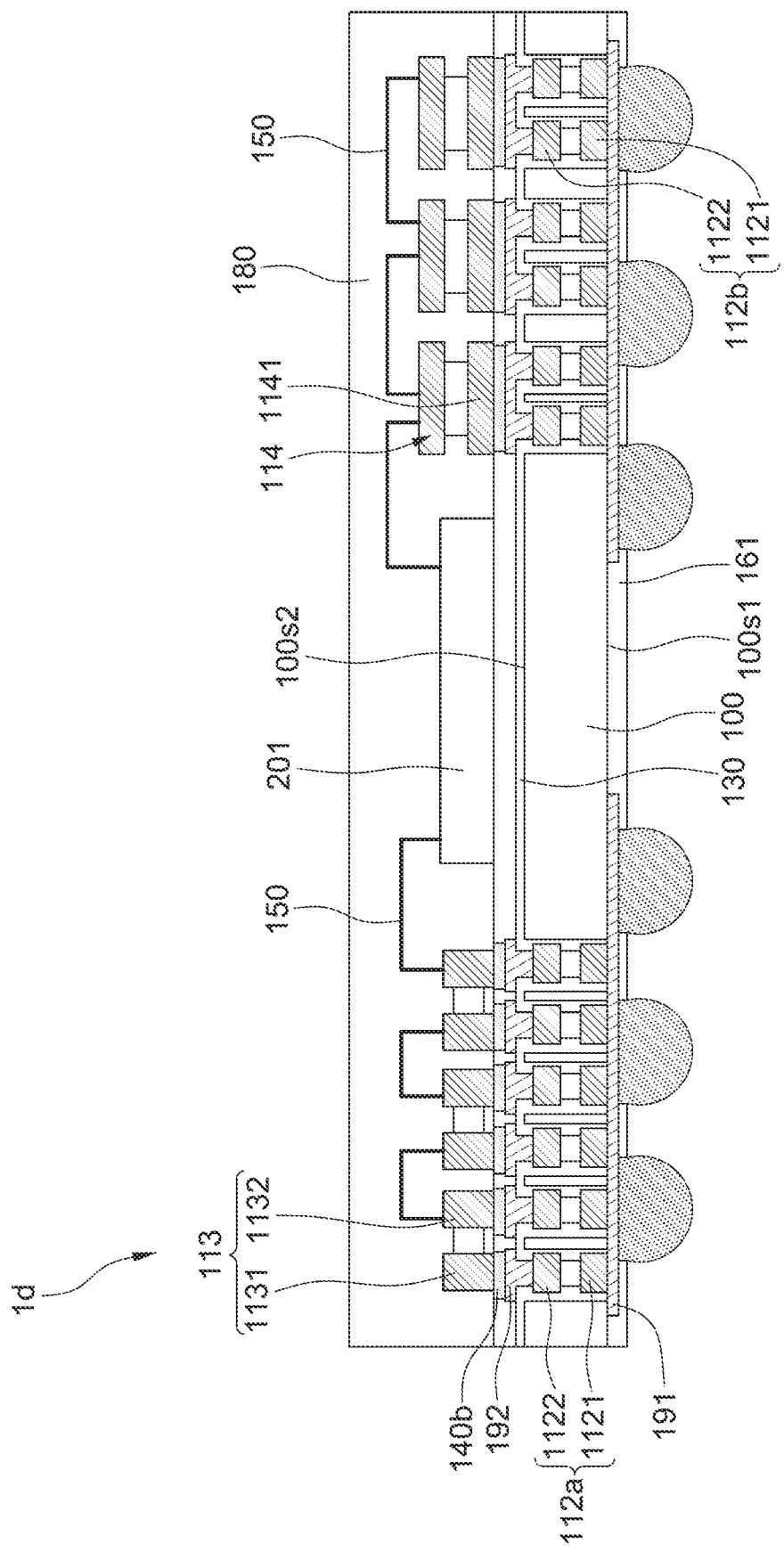

Referring to FIG. 8D, conductive protection layer(s) 140b may be formed to cover the terminals 1122 of the devices 112a and the devices 112b. Next, device(s) 113 may be disposed on the surface 100s2 of the substrate 100 and electrically connected to the devices 112a. The device(s) 114 may be disposed on the surface 100s2 of the substrate 100 and electrically connected to the devices 112b. The devices 112a may be electrically connected to each other in parallel, and the devices 112b may be electrically connected to each other in parallel. Next, conductive wire(s) 150, a dielectric layer 161, conductive element(s) 170, a device 201 and a package body 180 may be formed such that a semiconductor device structure the same as or similar to the semiconductor device structure 1d shown in FIG. 4 is produced.

It is contemplated that the pattern of the conductive layer 191 and/or the conductive layer 192 as well as the arrangement direction of the terminals of the passive device may be controlled in accordance with the design of the circuit. For example, if multiple passive devices are designed to be electrically connected to each other in series, the pattern of the conductive layer 191 and the conductive layer 192 may be modified to produce a semiconductor device structure the same as or similar to the semiconductor device structure 1e shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a substrate having a first surface and a second surface opposite to the first surface;
   a first passive device embedded in the substrate, wherein the first passive device comprises a first terminal and a second terminal, wherein the first terminal is closer to the first surface than to the second surface, and the second terminal is closer to the second surface than to the first surface;
   a second device electrically connected to the first passive device; and
   a pattern trace disposed on the second surface of the substrate, and the first passive device is electrically connected to the second device through the pattern trace.

2. The semiconductor package structure of claim 1, further comprising:
   a conductive wire bonded on the second surface and electrically connected to the first terminal.

3. The semiconductor package structure of claim 2, further comprising:
   a conductive wire-bonding-protection layer disposed between the second terminal and the conductive wire.

4. The semiconductor package structure of claim 1, wherein the second device is electrically connected to the first passive device in parallel.

5. The semiconductor package structure of claim 1, wherein the second device is disposed on the second surface of the substrate.

6. The semiconductor package structure of claim 5, wherein the second device comprises a first terminal and a second terminal, and an arrangement direction of the first terminal and the second terminal of the second device is substantially perpendicular to an arrangement direction of the first terminal and the second terminal of the first passive device.

7. The semiconductor package structure of claim 5, wherein an arrangement direction of the first terminal and the second terminal of the second device is substantially parallel to an arrangement direction of the first terminal and the second terminal of the first passive device.

8. The semiconductor package structure of claim 1, further comprising:
   a conductive wire disposed on the pattern trace, and the first passive device is electrically connected to the second device through the conductive wire.

9. The semiconductor package structure of claim 1, wherein an active surface of the second device faces the second surface of the substrate, and the second device includes a plurality of electrical connectors disposed on the active surface of the second device, and the first passive device is electrically connected to the second device through the electrical connectors.

10. The semiconductor package structure of claim 1, further comprising:
    a third device disposed on the second surface of the substrate, wherein the second device is electrically connected to the first passive device through the third device.

11. The semiconductor package structure of claim 1, further comprising:
    a third device embedded in the substrate and electrically connected to the first passive device.

12. A semiconductor package structure, comprising:
    a substrate having a first surface and a second surface opposite to the first surface;
    a first passive device embedded in the substrate, wherein the first passive device comprises a first terminal and a second terminal, wherein the first terminal is closer to the first surface than to the second surface, and the second terminal is closer to the second surface than to the first surface;
    a second device electrically connected to the first passive device, wherein the second device is electrically connected to the first passive device in parallel; and
    a third device electrically connected to the first passive device or the second device in series.

13. A semiconductor package structure, comprising:
    a substrate having a first surface and a second surface opposite to the first surface;
    a first passive device embedded in the substrate, wherein the first passive device comprises a first terminal and a second terminal, wherein the first terminal is closer to the first surface than to the second surface, and the second terminal is closer to the second surface than to the first surface;
    a second device electrically connected to the first passive device, wherein the second device is electrically connected to the first passive device in series.

14. The semiconductor package structure of claim 13, further comprising:
    a third device electrically connected to the second device and the first passive device in series.

* * * * *